United States Patent
Feuerstraeter et al.

(10) Patent No.: US 7,200,153 B2
(45) Date of Patent: Apr. 3, 2007

(54) METHOD AND APPARATUS FOR AUTOSENSING LAN VS WAN TO DETERMINE PORT TYPE

(75) Inventors: Mark T. Feuerstraeter, Granite Bay, CA (US); Bradley J. Booth, Austin, TX (US); Paul J. Weldon, Copenhagen (DK); Henning Lysdal, Roskilde (DK)

(73) Assignee: Intel Corporation, Santa Clara, CA (US)

( * ) Notice: Subject to any disclaimer, the term of this patent is extended or adjusted under 35 U.S.C. 154(b) by 957 days.

(21) Appl. No.: 09/960,007

(22) Filed: Sep. 20, 2001

(65) Prior Publication Data

US 2003/0058894 A1   Mar. 27, 2003

(51) Int. Cl.
  *H04J 3/22*   (2006.01)
  *H24L 12/28*   (2006.01)
  *H04L 12/66*   (2006.01)
(52) U.S. Cl. ............ 370/465; 370/254; 370/463
(58) Field of Classification Search ........... 370/901, 370/908, 465, 254, 466, 445, 463
  See application file for complete search history.

(56) References Cited

U.S. PATENT DOCUMENTS 4,013,840 A * 3/1977 Anderson ............ 370/261
4,270,202 A * 5/1981 Stuttard et al. ............ 370/468
4,890,316 A * 12/1989 Walsh et al. ............ 379/93.33
5,740,211 A * 4/1998 Bedrosian ............ 375/371
6,385,204 B1 * 5/2002 Hoefelmeyer et al. ...... 370/401
6,567,413 B1 * 5/2003 Denton et al. ............ 370/401
6,801,518 B2 * 10/2004 Mullaney et al. ........... 370/343

OTHER PUBLICATIONS

10GE WAN Phy Overview (or UniPHY WIS), IEEE 802.3ae Meeting, Ottawa, May 23-25, 2000, p. 36.*

* cited by examiner

*Primary Examiner*—Ricky Q. Ngo
*Assistant Examiner*—Warner Wong
(74) *Attorney, Agent, or Firm*—Blakely, Sokoloff, Taylor & Zafman LLP (57) ABSTRACT

An apparatus and method for automatically detecting the port type of a remote device are disclosed. One embodiment of the apparatus includes a data rate detection unit to sample a data rate from an incoming data signal. A first frequency configuration unit is operatively coupled with the data rate detection unit to receive a detected data rate from the data rate detection unit. The apparatus also includes an oscillator to generate a plurality of reference clock frequencies. A frequency selector unit is coupled with the oscillator to select one of the reference clock frequencies. A phase lock unit to phase lock the incoming data signal is coupled with the first frequency configuration unit. A data rate select output is coupled with the first frequency configuration unit to operatively link the first frequency configuration unit with a second frequency configuration unit of a remote device.

11 Claims, 6 Drawing Sheets

METHOD AND APPARATUS FOR AUTOSENSING LAN VS WAN TO DETERMINE PORT TYPE

BACKGROUND OF THE INVENTION

1. Field of Invention

This invention relates generally to network communications systems, and more specifically to network communications systems utilizing LAN and/or WAN configurations.

2. Art Background

Use of computer-based communication networks, wherein two or more computers are operatively linked together via a physical medium such as a cable or via a wireless connection, is widespread. Typically, computer networks are classified according to their geographical size. Local Access Networks (LANs) are the smallest of the networks, and are characterized by small geographical footprints. LANs are primarily used to link computers within an office, although they may be used to link adjacent office buildings. Metropolitan Area Networks (MAN's) are the next largest type of network, and typically operate at the city or regional level using Synchronous Optical Network (SONET) architecture and technology, which is well known in the art as a standard for connecting fiber optic transmission systems. Wide Area Networks (WANs) span the greatest geographical distances, often encompassing entire continents or countries. SONET has an international equivalent, standardized by the International Telecommunications Union (ITU), called Synchronous Digital Hierarchy (SDH). SDH defines a standard rate of transmission at 155.52 Mbps, which is referred to as STS-3 at the electrical level and STM-1 for SDH. STM-1 is equivalent to SONET's Optical Carrier (OC) level 3.

Prior art LANs are structured around an Ethernet protocol, which uses a bus or star topology capable of supporting data transfer rates of up to approximately 10 Mega bits per second (Mbps). Newer versions of Ethernet, called 100Base-T (or Fast Ethenet) or Gigabit Ethernet, support data transfer rates of 100 Mbps and 1 gigabit (1,000 megabits) per second.

Communication problems occur when LAN-configured devices attempt to communicate with WAN-configured devices, and vice versa, because LANs and WANs transmit data at different rates. The differences in data transfer rates result, in part, from the development of new data transmission standards for 10 Gigabit Ethernet, and from the existing SONET infrastructure underlying most WANs.

For example, a first node might be configured to communicate at 10 Mbps, while a second node might be configured to selectively communicate at 10 Mbps, 100 Mbps, or 1,000 Mbps. If the second node attempts to communicate with the first node at 100 Mbps or 1,000 Mbps, the handshake will be unsuccessful because the first node lacks the bandwidth necessary to process the information.

Institute of Electrical and Electronics Engineers (IEEE) standard 802.3 was proposed to delineate an auto-negotiation method whereby the first and second nodes could agree on what data rate to use when communicating with each other. The IEEE auto-negotiation method uses a mechanism such as link pulses to advertise, from both directions, the data rates each node is capable of adopting. The data rates are then compared to find the highest common denominator, and one or more of the nodes are reconfigured to use the shared data rate.

In the above example, link pulses associated with the first node indicate that the node transmits data at 10 Mbps. Similarly, link pulses associated with the second node indicate that it can transmit data at 10 Mbps, 100 Mbps, or 1000 Mbps. In this scenario, comparing the data rates reveals a highest common denominator of 10 Mbps. Accordingly, the second node will transmit data to and receive data from the first node at the 10 Mbps data rate, such that communication between the nodes continues as normal.

It should be noted that this prior art method, being a fixed scheme, does not actually look at the wire (or fiber) linking the two nodes to see at what speeds the data is being transmitted. Instead, each node advertises its transmission capabilities via commonly understood link signals transmitted back and forth between the nodes.

A solution is needed that automatically configures one or more devices residing in separate communication networks to communicate with each other when otherwise the devices would not. Another solution is needed that allows a manufacturer to build single devices addressing both the LAN and WAN 10 Gigabit Ethernet spaces. Yet another solution is needed that reduces the number of port types a user has to consider when attempting to link together two or more devices residing in separate communications networks.

BRIEF DESCRIPTION OF THE DRAWINGS

The present invention is illustrated by way of example and is not limited in the figures of the accompanying drawings, in which like references indicate similar elements.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those skilled in the art to practice the invention. The following detailed description is, therefore, not to be taken in a limiting sense, and the scope of the invention is defined only by the appended claims.

Portions of the detailed description, which follows, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is herein, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient to refer to these signals as bits, values, elements, symbol, characters, terms, numbers, or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the detailed description discussions utilizing terms such as "processing," "computing," "calculating," "determining," or the like, refer to the action and/or processes of a computer or computing system, or similar electronic computing device. Such a device manipulates and/or transforms data represented as physical, such as electronic quantities within the computing system's registers and/or memories into other data similarly represented as physical quantities within the computing system's memories, registers or other such information storage, transmission or display devices.

Embodiments of the invention may include apparatuses for performing the operations herein. These apparatuses may be specially constructed for the desired purposes, or they may comprise a general purpose-computing device selectively activated or reconfigured by a program stored in the device. Such a program may be stored on a storage medium, such as, but is not limited to, any type of disk including floppy disks, optical disk, CD-ROMs, magnetic-optical disks, read-only memories (ROMs), random access memories (RAMs), electrically programmable read only memories (EEPROMs), magnetic or optical cards, or any other type of media suitable for storing electronic instructions, and capable of being coupled to a system bus for a computing device.

In addition, embodiments of the invention are not described with reference to any particular programming language. It will be appreciated that a variety of programming languages may be used to implement the teachings of the invention as described herein.

It will be appreciated that the methods described in conjunction with the figures may be embodied in machine-executable instructions, e.g. software. The instructions can be used to cause a general-purpose or special-purpose processor that is programmed with the instructions to perform the operations described. Alternatively, the operations might be performed by specific hardware components that contain hardwired logic for performing the operations, or by any combination of programmed computer components and custom hardware components. The methods may be provided as a computer program product that may include a machine-readable medium having stored thereon instructions which may be used to program a computer (or other electronic devices) to perform the methods. For the purposes of this specification, the terms "machine-readable medium" shall be taken to include any medium that is capable of storing or encoding a sequence of instructions for execution by the machine and that cause the machine to perform any one of the methodologies of the present invention. The term "machine-readable medium" shall accordingly be taken to included, but not be limited to, solid-state memories, optical and magnetic disks, and carrier wave signals. Furthermore, it is common in the art to speak of software, in one form or another (e.g., program, procedure, process, application, module, logic . . . ), as taking an action or causing a result. Such expressions are merely a shorthand way of saying that execution of the software by a computer causes the processor of the computer to perform an action or a produce a result.

One embodiment of the invention may include one or more hardware or software embodiments of the serializers and deserializers described herein to facilitate communication with LANs and/or WANs.

As used herein, the term serializer refers to a device that receives data several bits at a time (in parallel) and retransmits the data received one bit at a time (serially). Depending on the embodiment, the serializer may retransmit serial data at a rate different from or equal to the parallel rate at which the data enters the serializer.

As used herein, the term deserializer refers to a device that receives data one bit at a time (serially) and retransmits the data several bits at a time (in parallel). Depending on the embodiment, the deserializer may retransmit data in parallel at a rate different from or equal to the rate at which serial data enters the deserializer. The terms "clock multiplier unit (CMU)" and "MUX" may be used interchangeably with the term "serializer." Similarly, the terms "Clock Recovery Unit (CRU)" and "DeMux" may be used interchangeably with the term "deserializer." The term "SerDes" refers to a chipset that contains both a serializer and a deserializer. The acronym IEEE represents the phrase "Institute of Electrical and Electronics Engineers." Other phrases and terms used herein are defined, in situ. If not, their meaning will be readily apparent from the accompanying Figures, surrounding text, and extrinsic sources. Should uncertainty in the definition of a claim term arise, the term should be interpreted in the broadest possible scope consistent with the spirit of the present invention.

Figure 1:
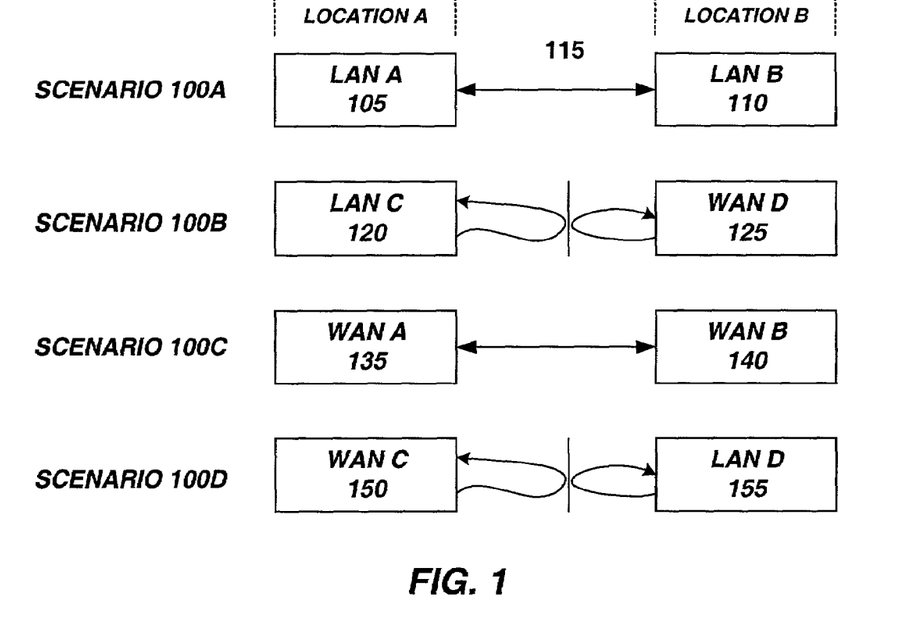
FIG. 1 is a diagram showing the breakdown in communication that occurs when devices from different systems attempt to communicate with each other.

FIG. 1 is a diagram showing the breakdown in communication that occurs when devices from different systems attempt to communicate with each other. Industry standards, such as IEEE 802.3ae, specify the speed associated with LANs and WANS. Specifically, LANs operate at approximately 10.31 GHz, while WANs operate at approximately 9.95 GHz. When a first LAN configured device 105, such as a computer, Ethernet card, or other electronic or digital device, is linked to a second LAN configured device 110, via communication link 115, which may be a fiber optic cable, both LAN devices are able to communicate with each other.

Although IEEE 802.3 only specifies fiber for 802.3ae, other embodiments of communication link 115 may include twisted pair copper wire or a wireless link. Similarly, linking a first WAN configured device 135 with a second WAN configured device 140, also permits the linked WAN devices to communicate with each other.

In conventional systems, however, breakdowns in communication occur whenever a LAN configured device 120 attempts to communicate with a WAN configured device 125, or whenever a WAN configured device 150 attempts to communicate with a LAN device 155, because the LAN and WAN devices transmit data at different rates. Thus, conventional communication devices capable only of operating in a single mode (e.g. only LAN OR only WAN) are limited to communicating only with other conventional communication devices of the same type. In contrast, embodiments of the present invention provide devices that can be auto-configured to operate in either LAN or WAN Ethernet spaces depending upon the port type of the device(s) generating an incoming data stream.

Figure 2:
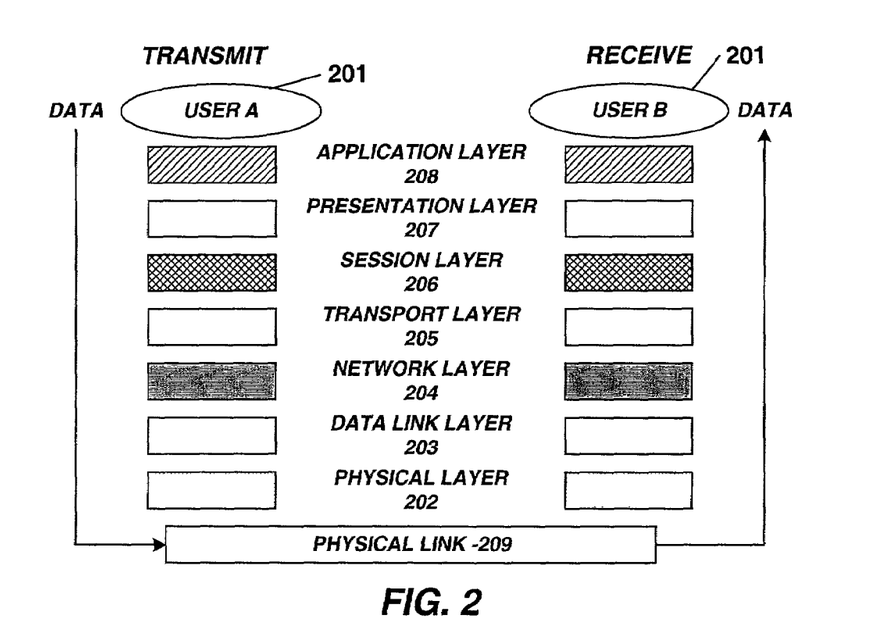
FIG. 2 is a diagram of the seven layered Open Systems Interconnection (OSI) model.

Referring now to FIG. 2, there is shown a diagram of the seven layer Open Systems Interconnection (OSI) reference model 200. Developed by the International Standards Organization (ISO) to specify how dissimilar computing devices such as Network Interface Cards (NICs), bridges, and routers exchange data over a network, the model consists of seven layers, which from lowest to highest are: a Physical Layer 202, a Data Link Layer 203, a Network Layer 204, a Transport Layer 205, a Session Layer 206, a Presentation Layer 207, and an Application Layer 208.

Figure 3:
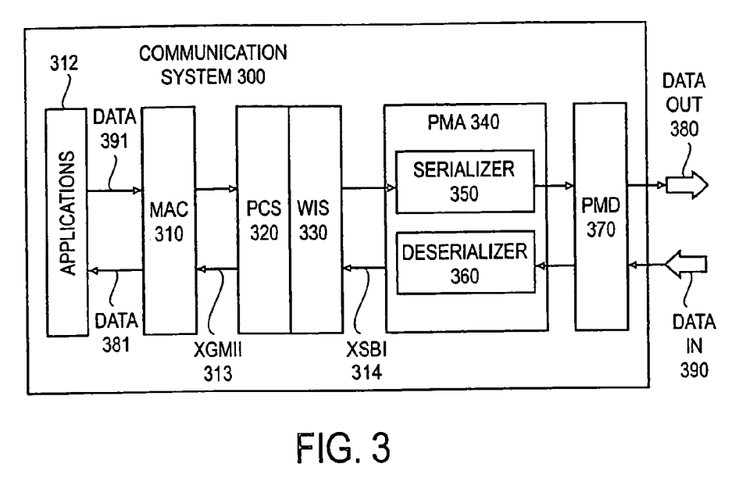
FIG. 3 is a diagram of a communication system according to one embodiment of the present invention.

As shown in FIG. 2, control is passed from one layer to the next starting at the application layer in one station 201, proceeding to the bottom layer, over the channel 209 to the next station 210 and back up the hierarchy. The physical layer 202 conveys the bit stream—electrical impulse, light, or radio signal—through the network at the electrical and mechanical levels. It provides the hardware means of sending and receiving data on a carrier, including defining cables, cards, and physical aspects. Subdivided into a Media Access Control (MAC) sublayer and a Logical Link Control (LLC) sublayer, the data link layer 203 furnishes transmission protocol knowledge and management and handles errors in the physical layer, flow control, and frame synchronization. Network layer 204 provides switching and routing technologies, creating logical paths, known as virtual circuits for transmitting data node to node, while Transport layer 205 provides transparent transfer of data between end systems, or hosts, and is responsible for end-to-end error recovery and flow control. Although embodiments of the present invention may be configured as software residing at higher levels of the OSI model, various embodiments of the present invention deal primarily with the different port types (e.g. LAN or WAN) found at the physical layer 202, FIG. 3 is a block diagram of a portion of a communications system 300 according to one embodiment of the invention. The various blocks represent hardware and/or software embodiments of components that may reside at various levels of the OSI model. For example, Physical Media Dependent (PMD) device 370, being dependent on the particular physical connection involved, e.g. a 1550 nanometer (nm), 1310 nm, or 850 nm laser, resides at the Physical layer 302, while Media Access Control (MAC) device 310, resides at Data Link layer 303. In one embodiment, communications system 300 is a 10 Gigabit serial Ethernet system, which may be used to receive data 390 and to transmit data 380 from and to other communications systems (not shown).

Illustratively, five components comprise communication system 300. As mentioned, Physical Media Dependent (PMD) device 370 varies according to the type of physical connection used to link two communications networks. Where optical fiber is used, PMD device 370 may be a 1550 nm, 1310 nm, or 850 nm laser, depending on the distance separating the networks. For distances up to 40 KM, 1550 nm lasers are used, while 850 nm lasers are used for distances approximately 60 m and shorter. In one embodiment, PMD device 370 receives serial data 390 at a rate of approximately 10.31 GHz or approximately 9.95 GHz and forwards the data to a deserializer 360 residing at the Physical Media Attachment layer 340 where the data is converted to a 16-bit or 32-bit parallel data stream and the incoming data rate is stepped down appropriately to conserve processing costs and power requirements. In one embodiment, this process is accomplished using a 10 Gigabit Sixteen Bit Interface (XSBI) 314. Where the 16-bit interface bus is used to link the PMA 340 layer with the WAN Interface Sublayer (WIS) 330, a 9.95 GHz WAN data stream will be stepped down to approximately 622 MHz (e.g. 9.95 GHz/16). Similarly, a 10.31 GHz LAN data stream will be stepped down to approximately 644 MHz.

The WAN Interface Sublayer (WIS) 330, in one embodiment, is used as a SONET packet framer/deframer. Under normal operating conditions, LAN data is first encoded using an industry known 64B/66B encoding standard, and then the raw serial data is transmitted at a data rate of approximately 10.31 GHz. In contrast, the SONET infrastructure and technology powering WAN networks encodes the raw serial data into frames prior to transmission.

It will be appreciated that even in WAN mode, data still will come from PCS and 64B/66B encoder 320. To be able to communicate with a WAN network, an embodiment of the present invention provides a WIS 330 configured to extract Ethernet data from the payload areas of incoming SONET packets. The WIS 330 may also be configured to encode Ethernet data received from the Physical Coding Sublayer (PCS) 320 into the payload areas of blank SONET frames prior to transmission. In passing, note that a LAN embodiment of communications system 300 may omit WIS 330.

Physical Coding Sublayer (PCS) 320 receives the encoded raw or extracted Ethernet data from WIS 330 and decodes it. Once decoded, the data is forwarded to the Media Access Control (MAC) sublayer 310 via a 10 Gigabit Media Independent Interface (XGMII) 313 or via a 10 Gigabit Attachment Unit Interface (XAUI) for further processing.

Media Access Control (MAC) sublayer 310, receives the decoded Ethernet frames and passes the data 381 to the appropriate destination address in Application Layer 312. MAC layer 310 also receives data 391 from Application Layer 311, and packages it into Ethernet frames together with a Destination Address, Source Address, and other information required by IEEE Standard 802.3. Once packaged, the Ethernet packets are sent over XGMII or XAUI 313 to PCS 320 for coding. If communications system 300 is linked to a LAN network, the coded Ethernet data bypasses WIS 330 and funnels directly into serializer 350, which serializes the data and bumps up the data rate to approximately 10.31 GHz for transmission via PMD 370. On the other hand, if communications system 300 is linked to a WAN network, the coded Ethernet data is forwarded to WIS 330, where it is loaded into the payload areas of SONET frames. The loaded SONET frames are then forwarded in parallel over XSBI 314 to serializer 350, which serializes the data stream and bumps up the data rate to approximately 9.95 Ghz for transmission via PMD 370. It will be appreciated that in the SONET world the XSBI 314 interface is called SF14 and is defined by the Optical Internet working Forum.

Figure 4:
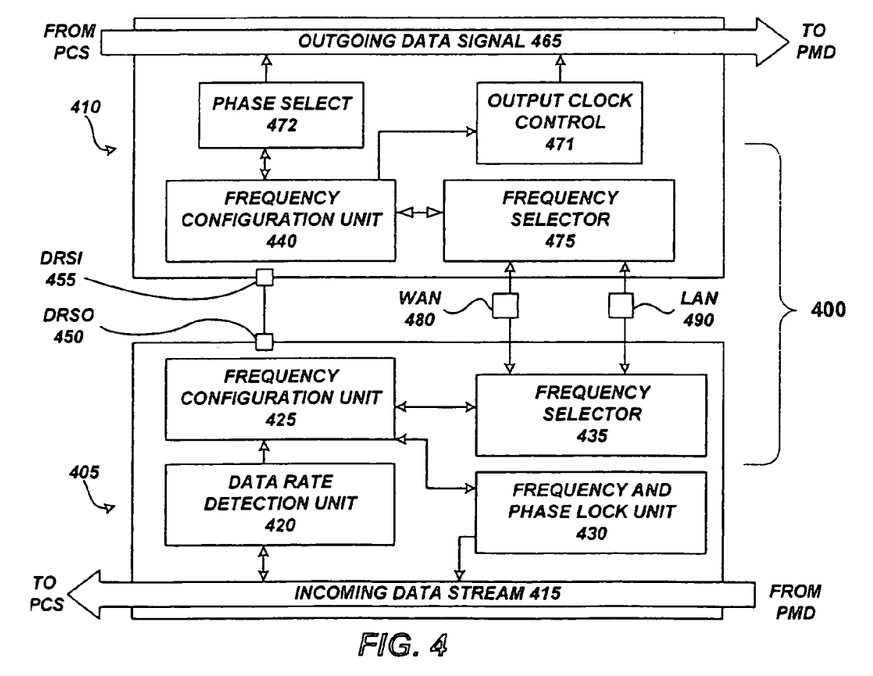
FIG. 4 is a diagram of one embodiment of a serializer/deserializer chipset usable with the present invention.

FIG. 4 is a block diagram showing a device 400 having a combined Serializer and Deserializer, according to one embodiment of the invention. Hereinafter, such a device is known as a SERDES device. In one embodiment, SERDES device 400 is configured to automatically configure itself to a WAN or LAN line data rate without user intervention. An embodiment of a method used to achieve auto-configuration involves automatically selecting a reference clock input appropriate to the line data rate and correctly configuring the internal logic of the SERDES device 400 to correspond to the line data rate.

In one embodiment, serializer 410 integrates all functions needed for multiplexing and clock generation. Deserializer 405 may be a demultiplexer (DEMUX) with clock recovery. In addition to clock and data outputs, it may feature a selectable divided by 64, 66, 128, or 132 output clock, which is useful in a LAN configuration, where it can be used to generate a 78.125, 125, or 156.25 clock frequencies for use in the Physical Coding Sublayer 320 shown in FIG. 3. In one embodiment, the deserializer 405 is able to automatically configure itself to LAN or WAN data rates. It may feature a control output that can be used to automatically configure the serializer 410 to the corresponding data rate.

Referring again to FIG. 4, an embodiment of deserializer 405 includes a frequency and phase lock unit 430, a data rate detection unit 420, a frequency selector unit 435, and a frequency configuration unit 425. Data line 415 represents the incoming data stream received from a remote LAN or WAN network (not shown). Data line 415 take the form of conventional data transfer mediums, such as a data bus. Data rate detection unit 420 samples the phase rate of the incoming data stream and determines the rate of data transfer, e.g. 10.31 GHz or 9.95 GHz. The determined data rate is then conveyed to the frequency configuration unit 425, which coordinates the process of locking to the incoming data stream by managing frequency selector unit 435 and frequency and phase lock unit 430. In one embodiment, dual external reference oscillators (clocks) 480 and 490 are provided to generate a plurality of reference frequencies that may be used to phase lock the incoming data stream. In one embodiment oscillator 480 generates WAN frequencies and oscillator 490 generates LAN frequencies.

Referring again to FIG. 4, serializer 410 and deserializer 405 may be configured to automatically select a reference clock frequency that is compatible with the incoming data rate and lock to the incoming data signal by coupling both devices to each other via Data Rate Serial Output (DRSO) 450 and Data Rate Serial Input (DRSI) 455. Additionally, both devices may be coupled with external reference oscillators (clocks) 480 and 490 as shown. In an alternate embodiment, the auto-configuration function of the serializer can be disabled by leaving the DRSO 450 and DRSI 455 unconnected and manually configuring the serializer 410 to correspond to the desired data rate. In such an embodiment, the deserializer 405's auto-configuration may be manually disabled.

In one embodiment, reference clock 480, corresponding to the WAN data rate, is connected to WAN data rate connects on each device. Similarly, reference clock 490, corresponding to the LAN data rate, is connected to LAN data rate connects on each device. The two reference clocks must have the same frequency ratio to the WAN and LAN data rates, for example 155.52 MHz and 156.25 MHz ($\frac{1}{64}^{th}$ of the serial line rate).

In one embodiment, data rate detection unit 420 detects the reception of an incoming data stream and determines the data rate. Upon detection of the data rate, the frequency configuration unit 425 coordinates with frequency selector unit 435 such that frequency selector unit 435 selects one of the plurality of frequencies to be used as a reference frequency. Upon selecting a reference frequency, the frequency selector unit 435 communicates its choice back to the frequency configuration unit 425, which instructs the frequency and phase lock unit 430 to use the selected reference frequency in an attempt to lock to the incoming data stream. If no lock is achieved, a different reference frequency may be selected and tried, and the process repeated until a lock is achieved or a time-out period expires. When a lock is achieved, Data Rate Serial Output (DRSO) 450 may be used to automatically configure serializer 410 to correspond to the detected data rate.

In one embodiment, frequency configuration unit 425 is a Clock DeMultiplier Unit (CDMU), which may be configured with multiple different division factors such as: 16, 64, 66, 18, and 132. Similarly, serializer 410's frequency configuration unit 440 may be a Clock Multiplier Unit (CMU), which may be configured to the same five different multiplication factors. The CDMU steps down the incoming data rate from either 10.31 GHz or 9.95 GHz to correspond to a data rate that the PCS 320 or WIS 330 (of FIG. 3) can handle, while the CMU steps up the data rate received from the PCS 320 or WIS 330 to either 10.31 GHz or 9.95 GHz for transmission of the data to a remote network. The application of these rates to different LAN and WAN configurations is further described with reference to FIG. 5 and Tables 1 and 2.

In one embodiment, the transmit clock 471 may be generated by frequency locking an on-chip, high performance Voltage Controlled Oscillator (VCO) to an external reference. The deserializer 405's receive clock may be generated by phase and frequency locking an on-chip VCO to the incoming data stream. When an input data stream at the right frequency (CMU ratio times the reference clock frequency) is present, the deserializer clock domain is controlled by the input data.

Referring again to FIG. 4, serializer 410 includes frequency and phase lock unit 470, a frequency configuration unit 440, a frequency selector unit 475, and a phase selector 472. Data line 465 represents the incoming flow of data from the PCS 320 shown in FIG. 3, and may take the form of a conventional data transfer medium, such as a data bus. Phase selector 472 selects the input sampling phase. Frequency selector unit 475 selects an appropriate reference clock frequency, which the frequency configuration unit 440 multiplies to step up the outgoing data rate to approximately 10.31 GHz or 9.95 GHz for transmission to a remote network.

Figure 5:
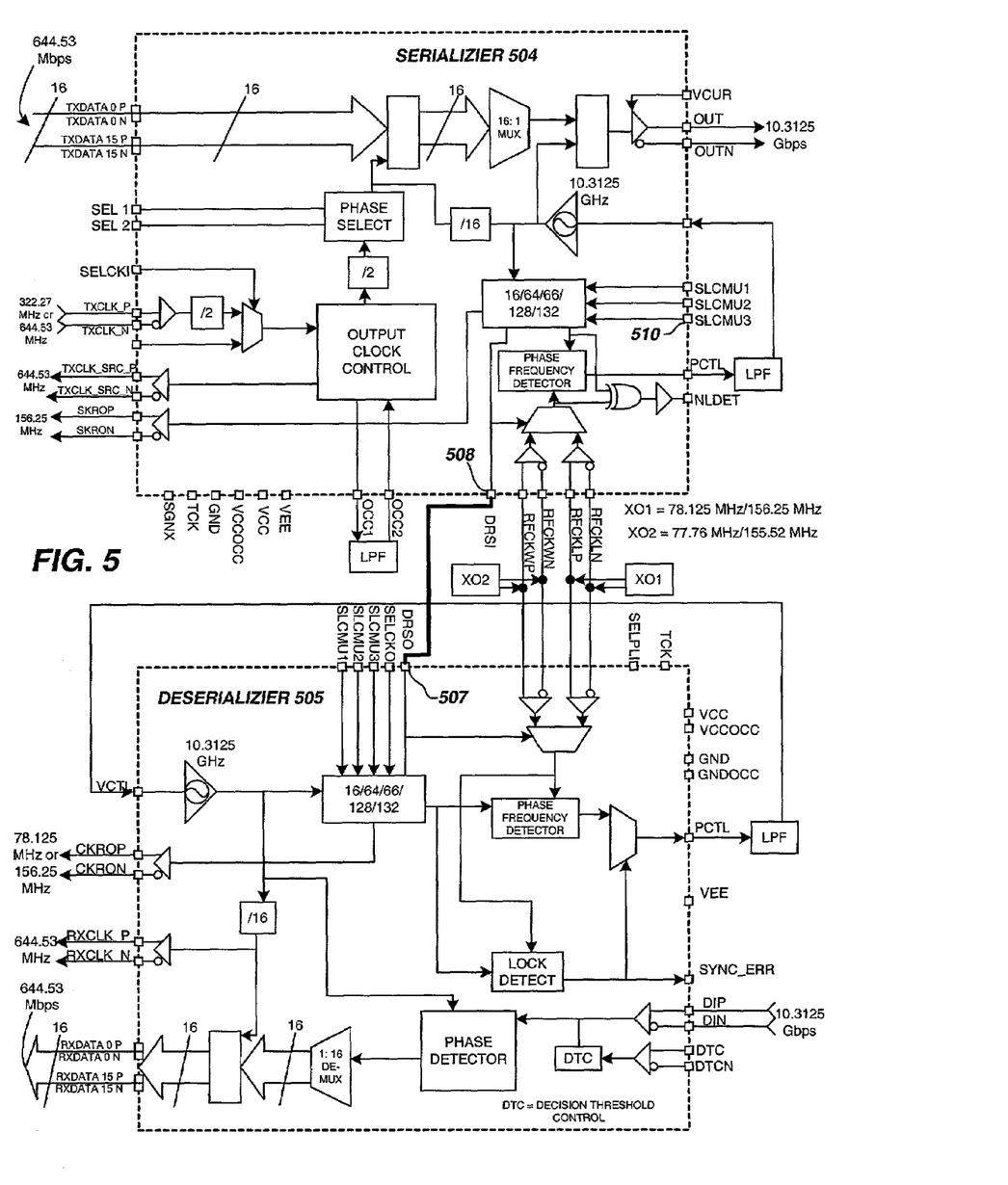
FIG. 5 is a schematic showing one embodiment of a serdes device, which includes a serializer and a deserializer.

FIG. 5 is a schematic showing one embodiment of a SERDES device 500, which includes a serializer 504 and a deserializer 505. In FIG. 5, the SERDES device is shown configured for a 10.31 GHz LAN network. In this configuration, the CMU 510 is in the ×66 or ×132 mode. The PCS transmit rate can be clocked directly off the 156.25 MHz reference clock and the deserializer may generate output clocks at both the parallel data rate and a 3.125% slower (/4 or /8) PCS clock. Optionally, the CMU's can be configured in the ×16, the ×64 or the ×128 mode (WAN configuration). In this configuration, the reference clock frequency should be increased by 3.125%. Box X02 is a WAN reference clock. Box X01 is a LAN reference clock. Tables 1 and 2, below provide various clock frequencies that may be associated with various embodiments of the present invention.

TABLE 1

Serializer Modes

| SLCMU 1, 2, 3 | CMU ratio $f_{line}/f_{RFCK}$ | CKROP/N ratio $f_{line}/F_{CKROP/N}$ | EXAMPLE |
| --- | --- | --- | --- |
| 1, 1, 1 | 66 | 66 | LAN rate, 156.25 MHz RFCKP/N, 156.25 MHz CKROP/N |
| 1, 1, 0 | 64 | 66 | WAN rate, 155.52 MHz RFCKP/N, 622.08 MHz CKROP/N |
| 1, 0, 1 | 132 | 66 | LAN rate, 78.125 MHz RFCKP/N, 156.25 MHz CKROP/N |
| 1, 0, 0 | 128 | 16 | WAN rate, 77.76 MHz RFCKP/N, 622.08 MHz CKROP/N |
| 0, 1, 1 | 64 | 66 | LAN rate, 161.1328125 MHz RFCKP/N, 156.25 MHz CKROP/N |
| 0, 1, 0 | 16 | 16 | WAN rate, 622.08 MHz RFCKP/N, 622.08 MHz CKROP/N |
| 0, 0, 1 | 16 | 66 | LAN rate, 644.53125 MHz RFCKP/N, 156.25 MHz CKROP/N |

TABLE 2

Deserializer Modes

| SLCMU 1, 2, 3 | CMU ratio $f_{line}/f_{RFCK}$ | SELCKO | CKROP/N ratio $f_{line}/F_{CKROP/N}$ | EXAMPLE |
|---|---|---|---|---|
| 1, 1, 1 | 66 | 0 | 132 | LAN rate, 156.25 MHz RFCKP/N, 78.125 MHz CKROP/N |
|  |  | 1 | 66 | LAN rate, 156.25 MHz RFCKP/N, 156.25 MHz CKROP/N |
| 1, 1, 0 | 66 | 0 | 128 | WAN rate, 155.52 MHz RFCKP/N, 77.76 MHz CKROP/N |
|  |  | 1 | 64 | WAN rate, 155.52 MHz RFCKP/N, 155.52 MHz CKROP/N |
| 1, 0, 1 | 66 | 0 | 132 | LAN rate, 78.125 MHz RFCKP/N, 78.125 MHz CKROP/N |
|  |  | 1 | 66 | LAN rate, 78.125 MHz RFCKP/N, 156.25 MHz CKROP/N |
| 1, 0, 0 | 66 | 0 | 128 | WAN rate, 77.76 MHz RFCKP/N, 77.76 MHz CKROP/N |
|  |  | 1 | 64 | WAN rate, 77.76 MHz RFCKP/N, 155.52 MHz CKROP/N |
| 0, 1, 1 | 66 | 0 | 132 | LAN rate, 161.1328125 MHz RFCKP/N, 78.125 MHz CKROP/N |
|  |  | 1 | 66 | LAN rate, 161.1328125 MHz RFCKP/N, 156.25 MHz CKROP/N |
| 0, x, 0 | 66 | 0 | 128 | WAN rate, 622.08 MHz RFCKP/N, 77.76 MHz CKROP/N |
|  |  | 1 | 64 | WAN rate, 622.08 MHz RFCKP/N, 155.52 MHz CKROP/N |
| 0, 0, 1 | 66 | 0 | 132 | LAN rate, 644.53125 MHz RFCKP/N, 78.125 MHz CKROP/N |
|  |  | 1 | 66 | LAN rate, 644.53125 MHz RFCKP/N, 156.25 MHz CKROP/N |

Figure 6A:
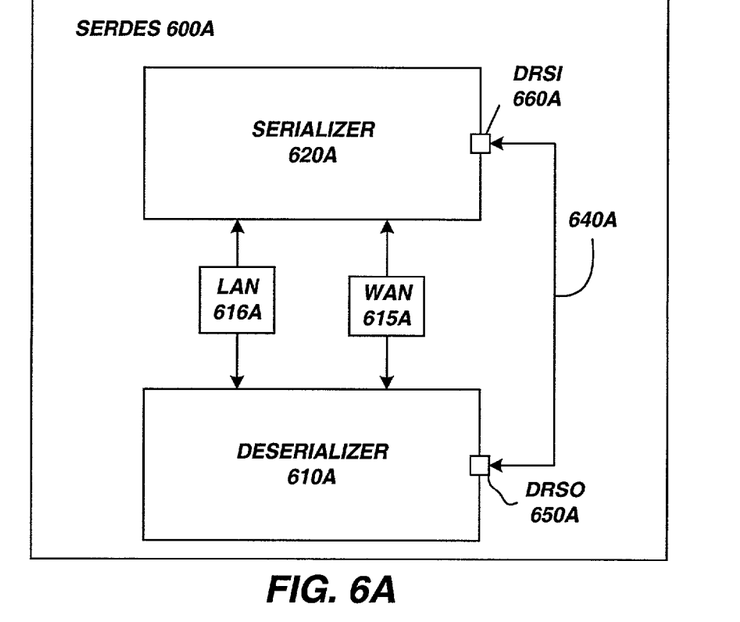
FIGS. 6a and 6b are block diagrams further illustrating additional embodiments of the invention.

Referring again to FIG. 5, the serializer 504 of SERDES device 500 is configured to automatically switch between LAN and WAN modes in response from control commands received from the deserializer 505, because DRSO 507 and DRSI 508 are connected. However, in another embodiment shown in FIG. 6, the auto-configuration of serializer 620A may be disabled by decoupling DRSO 650A and DRSI 660A as shown.

Referring back to FIG. 5, an illustrative auto-configuration process is now described. At startup, the Voltage Controlled Oscillator (VCO) 525 frequency of the deserializer 505 is aligned to one of the two available external reference clocks, X02 and X01, and the device will attempt to phase lock to the incoming data. If the serial data is at a different, relative frequency, the deserializer 505 will switch to the other reference clock, align the VCO 525 to this frequency, and attempt to phase lock to the input data.

When deserializer 505 is phase locked to the input data, the Data Rate Select Output (DRSO) signal can be used to configure serializer 504 to the corresponding data rate. The DRSO 507 should be connected to Data Rate Select Input (DRSI) 508.

In one embodiment, serializer 504 has a built in time delay of approximately 1.6 milliseconds. However, this delay is illustrative only, as the delay required may change depending on the incoming data rate, device configuration, and other factors. The time delay may be operational when the device is switched from LAN to WAN by deserializer 505. In one embodiment, when deserializer 505 changes serializer 504 from WAN to LAN, no delay is present.

The time delay ensures that a default LAN rate will be obtained with no line rate contention when auto-configured devices are present at both ports (e.g. one in the transmitting network and one in the receiving network).

For an explanation of the time delay feature, consider a case where port A is in LAN mode and port B is in WAN mode. Simultaneously, both ports detect they are in incompatible modes and change. However, because port A flips to WAN mode and port B simultaneously flips to LAN mode, the problem of incompatibility remains. This is fixed by implementing a time delay when a LAN configured serializer switches to a WAN configuration.

In the example above, a different result is achieved when one or both ports are configured to have a time delay feature. Thus, in the example above, when port B immediately switches both serializer and deserializer from WAN mode to LAN mode, port A initially switches only its deserializer to WAN mode and triggers a time delay to start counting in port A's serializer. Before port A's serializer switches to WAN mode, port A's deserializer detects port B's change to LAN mode and switches itself back to LAN mode. The serializer in port A never completes the switch to WAN mode and stays in LAN mode such that both ports are now in LAN mode. In one embodiment, a system will default to the LAN mode if both ports are equipped with at least this feature of the invention.

Referring now to SLCMU3 input 510 in FIG. 5, if the auto-configuration function is disabled, input 510 should be set to 1 for LAN rates and 0 for WAN rates for both serializer 504 and deserializer 505. In one embodiment, when no data is present at the deserializer 505 input, the device will continuously switch from the one reference clock to the other. This process may continue indefinitely until input data is present. The frequency of the output clock (CKROP) may alternate between 156.25 MHz and 155.52 MHz (assuming SELCKO=1) in the absence of data.

Figure 6B:
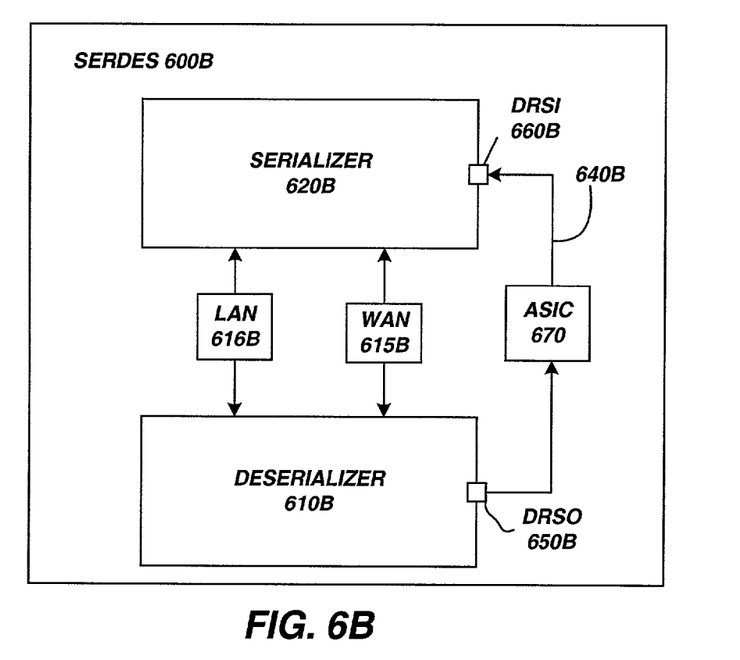

FIGS. 6a and 6b are block diagrams illustrating further embodiments of the invention. As shown in FIG. 6a, a SERDES chipset 600A may include serializer 620A and deserializer 610A. One or more external reference clocks 615 and 616A may be coupled with both serializer 620A and deserializer 610A to provide WAN and LAN reference clock frequencies. Deserializer 610A is coupled with an incoming data stream 605A to determine the incoming data rate. The serializer 620A and deserializer 610A may both be connected for an automatic data rate configuration by coupling deserializer 610A's DRSO 650A with serializer 620A's DRSI 660A. In this configuration, a time delay feature, such as that described above, is used to ensure synchronization of port types.

FIG. 6b illustrates another embodiment of the invention in which a random algorithm replaces the time delay feature. As shown in FIG. 6b, SERDES chipset 600B includes a serializer 620B and deserializer 610B. One or more reference clocks 616B and 615B may be coupled with both serializer 620B and deserializer 610B to provide WAN and LAN reference clock frequencies. Deserializer 610B is coupled with an incoming data stream to determine the incoming data rate. DRSO 650B is coupled with an Application Specific Integrated Circuit (ASIC) 670B, which is also coupled with DRSI 660B and configured to implement a random algorithm to determine whether serializer 620B should be switched to a particular LAN or WAN mode. In this embodiment, the random algorithm replaces the time delay feature, mentioned above. Depending on the embodiment, DRSO 650B may contain multiple bits, and ASIC 670B may be coupled with a plurality of DRSI's 660B.

Figure 7:
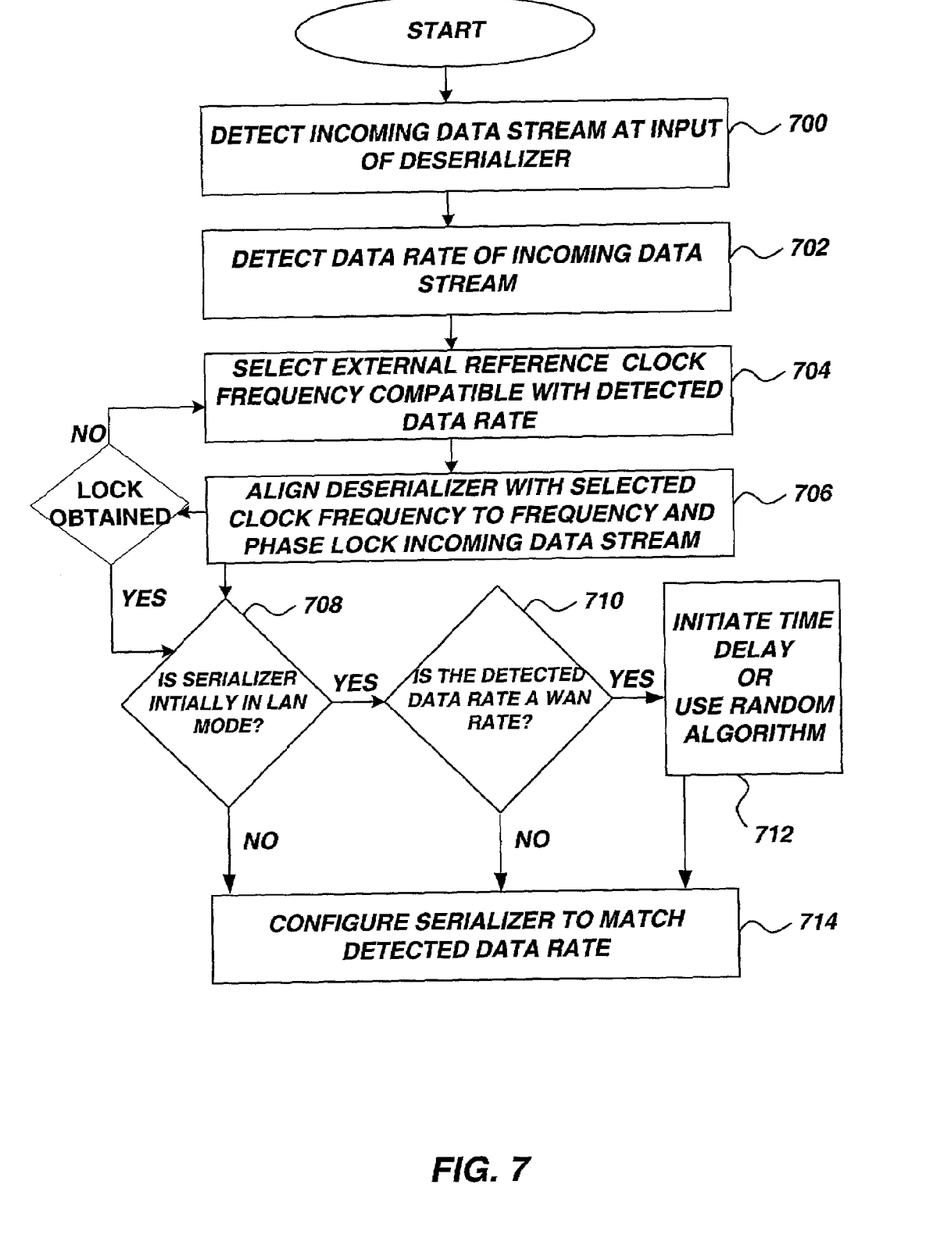
FIG. 7 is a flowchart illustrating one embodiment of a method usable with the present invention.

FIG. 7 is a flowchart illustrating one embodiment of a method useable with the present invention. The method begins at Block 700, where an incoming data stream is detected at the input of the deserializer. At Block 702, the data rate of the incoming data stream is determined. At Block 704, an external reference clock frequency compatible with the detected data rate is selected. At Block 706, the deserializer aligns with the selected external reference clock frequency, to frequency and phase lock the incoming data. In one embodiment, represented by Block 715, if no lock is obtained, the method loops back to Block 704, where another external reference clock frequency is selected. If a lock is obtained, the method proceeds to Block 708, where the initial mode of the serializer is determined. If the serializer is initially in the LAN mode, the method proceeds to Block 710. If the initial mode of the serializer is not LAN mode, the method proceeds to Block 714 where the serializer is configured to match the detected data rate.

Referring again to Block 710, the method determines whether the detected data rate is a WAN data rate. If not, the method passes from Block 710 to previously described Block 714. If the detected data rate is a WAN rate, the method passes to Block 712, where a time delay or a random algorithm is selected. Illustratively, the time delay is approximately 1.6 milliseconds. Upon expiration of the time delay or execution of the random algorithm, the serializer is configured to match the detected data rate (Block 714 ).

Figure 8:
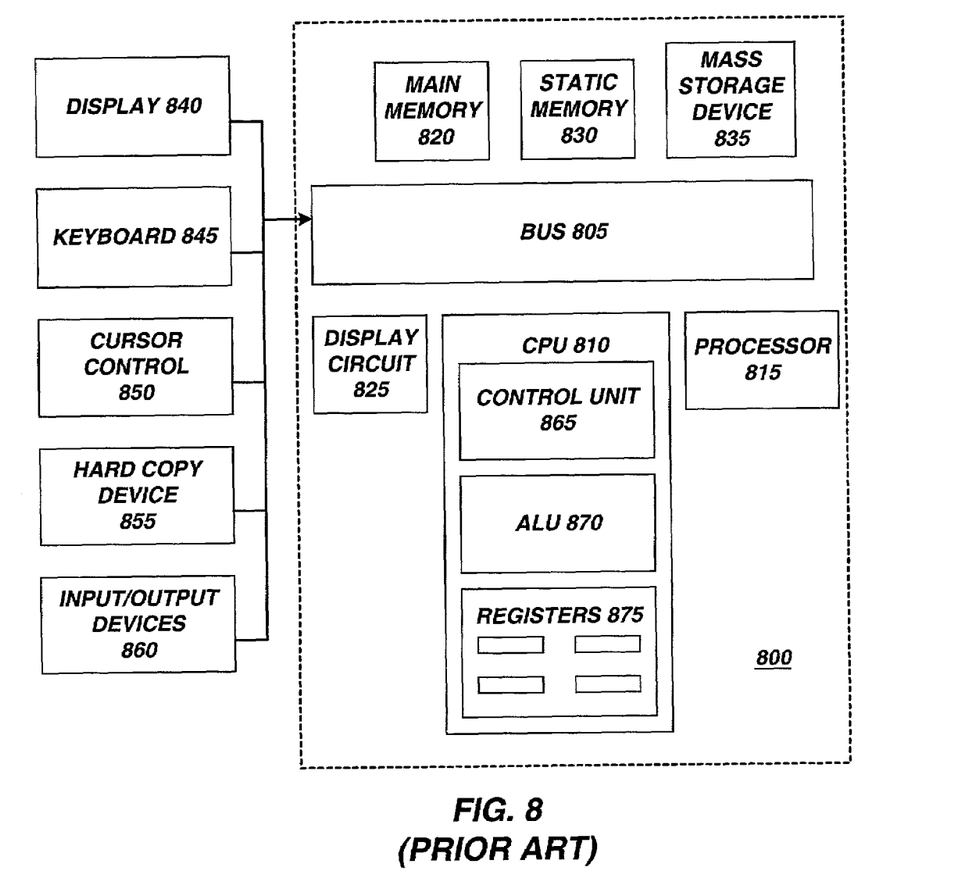
FIG. 8 depicts an exemplary conventional digital process system that may be used with an embodiment of the present invention.

FIG. 8 depicts an exemplary conventional digital processing system that may be used with an embodiment of the present invention. Various embodiments of the LAN/WAN synchronization techniques (or parts thereof) described herein may be implemented as software or hardware on a personal computer architecture, such as that illustratively shown in FIG. 8.

Referring to FIG. 8, digital processing system 800 includes a bus 805 or other communication means for communicating information, and a Central Processing Unit (CPU) 810 coupled with bus 805 for processing information. CPU 810 includes a control unit 765, an Arithmetic Logic Unit (ALU) 870, and several registers 875, which may be one or more of several types of registers well known in the art, such as, but not limited to: predicate registers, spill and fill registers, floating point registers, integer registers, general registers, and other similar types of registers. A processor 815 may also be included and coupled to bus 805 to provide additional processing power.

Also included in digital processing system 800 is a main memory 820, which may be a Random Access Memory (RAM) or some other dynamic storage device, which is coupled to a bus 805. Main memory 820 may store information and instructions to be executed by CPU 810, and may also store temporary variables or other intermediate information during execution of instructions by CPU 810. A static memory 830, such as a Read Only Memory (ROM) and/or other static storage device, may also be included and coupled with bus 805 to store static information and instructions for CPU 810. To store additional information and instructions, a mass storage device 835, such as a hard or floppy disk drive, may also be included.

Display device 840, of a type known in the art, such as, but not limited to, Flat Panel Displays (FPDs) and Cathode Ray Tube (CRT) monitors, may be coupled to bus 805 to display information to a computer user. To communicate information and command selections to CPU 810, a keyboard 845 or other alphanumeric input device may also be coupled to bus 805. Similarly, a cursor control device 850, such as a trackpad, mouse, or cursor direction keys, may be coupled to bus 805 to communicate direction information and command selections to CPU 810 and to control cursor movement on display 840. Hard copy device 855 may be coupled to bus 805 to print instructions, data, or other information on paper, film, or some other storage medium. Additional input/output devices, such as digital cameras, flatbed scanners, external DVD/CD ROM drives, Personal Digital Assistants (PDAs), and other peripheral devices, may also be coupled to bus 805.

Thus, a novel Method and Apparatus for Autosensing LAN vs WAN to Determine Port Type is described. Although the invention is described herein with reference to specific preferred embodiments, many modifications therein will readily occur to those of ordinary skill in the art. Accordingly, all such variations and modifications are included within the intended scope of the invention as defined by the following claims.

What is claimed is:

1. A method, comprising:
    selecting a first frequency from a plurality of reference frequencies;
    configuring a first device to align with the first frequency;
    making a first attempt to phase lock the first device with an incoming data stream;
    if the first attempt succeeds, then generating a data rate signal corresponding to the first frequency;
    if the first attempt does not succeed, then
        selecting a second frequency of the plurality of reference frequencies,
        configuring the first device to align with the second frequency,
        making a second attempt to phase lock the first device with an incoming data stream,
        if the second attempt succeeds, then generating a data rate signal corresponding to the second frequency;
    if a second device is initially aligned to a Local Area Network (LAN) reference frequency and the reference frequency corresponding to the data rate signal is a WAN reference frequency,
        then delaying for a time interval,
        then aligning the second device with the reference frequency corresponding to the data rate signal; and
    if the second device is initially aligned to a Wide Area Network (WAN) reference frequency, then aligning the second device with the reference frequency corresponding to the data rate signal.

2. The method of claim 1, wherein the time interval is long enough to prevent line rate contention.

3. A method, comprising:
    selecting a first frequency from a plurality of reference frequencies;
    configuring a first device to align with the first frequency;
    making a first attempt to phase lock the first device with an incoming data stream;
    if the first attempt succeeds, then configuring a second device to align with the first frequency;
    if the second device is initially aligned to a Local Area Network (LAN) reference frequency and the first frequency is a WAN reference frequency, then delaying for a time interval,
then aligning the second device with the first frequency;
if the serializer is initially aligned to a Wide Area Network (WAN) reference frequency, then aligning the second device with the first frequency; and
if the first attempt does not succeed, then
selecting a second frequency of the plurality of reference frequencies,
configuring the first device to align with the second frequency,
making a second attempt to phase lock the first device with an incoming data stream,
if the second attempt succeeds, then configuring the second device to align with the second frequency.

4. A method, comprising:
selecting a first frequency from a plurality of reference frequencies;
configuring a first device to align with the first frequency;
making a first attempt to phase lock the first device with an incoming data stream;
if the first attempt succeeds, then configuring a second device to align with the first frequency;
if the first attempt does not succeed, then
selecting a second frequency of the plurality of reference freqencies,
configuring the first device to align with the second frequency,
making a second attempt to phase lock the first device with an incoming data stream,
if the second attempt succeeds, then configuring the second device to align with the second frequency;
if the second device is initially aligned to a Local Area Network (LAN) reference frequency and the second frequency is a WAN reference frequency,
then delaying for a time interval,
then aligning the second device with the second frequency; and
if the second device is initially aligned to a Wide Area Network (WAN) reference frequency, then aligning the second device with the second frequency.

5. The method of claim 3, wherein the time interval is long enough to prevent line rate contention.

6. An apparatus, comprising:
a first frequency selector to select a first frequency of a plurality of reference frequencies;
a phase lock unit coupled with the first frequency selector to attempt to phase lock an incoming data stream with the first frequency,
if the phase lock attempt fails, to signal the first frequency selector to select a second frequency of the plurality of reference clock frequencies;
a data rate select output coupled with the phase lock unit to generate a data rate signal corresponding to the reference frequency that the phase lock unit has successfully phase locked to the incoming data stream;
a data rate select input to receive the data rate signal;
a second frequency selector coupled with the data rate select input to select the reference frequency corresponding to the data rate signal;
an output clock control coupled with the second frequency selector to clock an outgoing data signal according to the reference frequency selected by the second frequency selector; and
a timer coupled with the second frequency selector to cause the second frequency selector to observe a time delay before selecting the reference frequency corresponding to the data rate signal if the reference frequency used initially to clock the outgoing data stream is a Local Area Network (LAN) reference frequency and the reference frequency corresponding to the data rate signal is a WAN reference frequency.

7. An article of manufacture comprising:
a computer readable medium storing computer executable code, when accessed by a computer, cause the computer to perform operations comprising:
selecting a first frequency from a plurality of reference frequencies,
making a first attempt to phase lock the first frequency with an incoming data stream,
if the first attempt succeeds, generating a data rate value corresponding to the first frequency,
if the first attempt does not succeed, then
selecting a second frequency of the plurality of reference frequencies,
making a second attempt to phase lock the second frequency with an incoming data stream,
if the second attempt succeeds, generating a data rate value corresponding to the second frequency,
if the reference frequency used initially to clock the outgoing data stream is a Local Area Network (LAN) reference frequency and the reference frequency corresponding to the data rate value is a WAN reference frequency,
then delaying for a time interval,
then clocking the outgoing data stream with the reference frequency corresponding to the data rate value; and
if the reference frequency used initially to clock the outgoing data stream is a Wide Area Network (WAN) reference frequency, then clocking the outgoing data stream with the reference frequency corresponding to the data rate value.

8. The article of manufacture of claim 7, wherein the time interval is long enough to prevent line rate contention.

9. A system, comprising:
a deserializer including,
a first frequency selector to select a first frequency of a plurality of reference frequencies,
a phase lock unit coupled with the first frequency selector to attempt to phase lock an incoming data stream with the first frequency,
if the phase lock attempt fails, to signal the first frequency selector to select a second frequency of the plurality of reference clock frequencies,
a data rate select output coupled with the phase lock unit to generate a data rate signal corresponding to the reference frequency the phase lock unit has successfully phase locked to the incoming data stream;
a serializer including,
a data rate select input,
a second frequency selector coupled with the data rate select input to select one of the plurality of reference frequencies, wherein the reference frequency selected is determined by a signal received at the data rate select input,
an output clock control coupled with the second frequency selector to clock an outgoing data signal according to the reference frequency selected by the second frequency selector,
a timer coupled with the second frequency selector to cause the second frequency selector to observe a time delay before selecting the reference frequency corresponding to the data rate signal if the reference frequency used initially to clock the outgoing data stream is a Local Area Network (LAN) reference frequency and the reference frequency corresponding to the data rate signal is a WAN reference frequency;

a transmission line to carry the incoming data stream, wherein the transmission line is optical fiber or metallic wire; and an interconnect from the data rate select output to the data rate select input to cause the signal received at the data rate select input to be the data rate signal.

10. The system of claim 9, wherein the time interval is long enough to prevent line rate contention.

11. A system, comprising:

a computer readable medium storing computer executable code, when accessed by a computer, cause the computer to perform operations comprising:

selecting a first frequency from a plurality of reference frequencies, making a first attempt to phase lock the first frequency with an incoming data stream, if the first attempt succeeds, then generating a data rate value corresponding to the first frequency, if the first attempt does not succeed, then selecting a second frequency of the plurality of reference frequencies;

making a second attempt to phase lock the second frequency with an incoming data stream, if the second attempt succeeds, then generating a data rate value corresponding to the second frequency, clocking an outgoing serial data signal in accordance with the frequency corresponding to the data rate value, if the reference frequency used initially to clock the outgoing data stream is a Local Area Network (LAN) reference frequency and the reference frequency corresponding to the data rate value is a WAN reference frequency, then delaying for a time; interval, then clocking the outgoing data stream with the reference frequency corresponding to the data rate value, if the reference frequency used initially to clock the outgoing data stream is a Wide Area Network (WAN) reference frequency, then clocking the outgoing data stream with the reference frequency corresponding to the data rate value; and a transmission line to carry the incoming data stream, wherein the transmission line is optical fiber or metallic wire.

* * * * *